United States Patent
Matthews (10) Patent No.: US 7,518,443 B2
(45) Date of Patent: Apr. 14, 2009

(54) AMPLIFIER CIRCUIT AND METHOD FOR REDUCING VOLTAGE AND CURRENT NOISE

(75) Inventor: Robert Matthews, San Diego, CA (US)

(73) Assignee: Quantum Applied Science & Research, Inc., San Diego, CA (US)

( * ) Notice: Subject to any disclaimer, the term of this patent is extended or adjusted under 35 U.S.C. 154(b) by 0 days.

(21) Appl. No.: 11/662,381

(22) PCT Filed: Sep. 9, 2005

(86) PCT No.: PCT/US2005/032358

§ 371 (c)(1),
(2), (4) Date: Mar. 9, 2007

(87) PCT Pub. No.: WO2006/031704

PCT Pub. Date: Mar. 23, 2006

(65) Prior Publication Data

US 2008/0111621 A1    May 15, 2008

Related U.S. Application Data

(60) Provisional application No. 60/608,366, filed on Sep. 10, 2004.

(51) Int. Cl.
*H03F 3/38* (2006.01)
(52) U.S. Cl. .............................. 330/10; 330/9
(58) Field of Classification Search ..................... 330/9, 330/10, 51
See application file for complete search history.

(56) References Cited

U.S. PATENT DOCUMENTS

| 4,207,478 | A | 6/1980 | Marumoto et al. |
| 4,577,160 | A | 3/1986 | Lettvin et al. |
| 5,959,498 | A | 9/1999 | Sauer |
| 6,242,974 | B1 * | 6/2001 | Kunst ............................ 330/9 |
| 6,366,099 | B1 | 4/2002 | Reddi |

(Continued)

FOREIGN PATENT DOCUMENTS

GB        1127268        9/1968

OTHER PUBLICATIONS

Goldberg, "Stabilization of Wide-Band Direct-Current Amplifiers for Zero and Gain", RCA Review, pp. 296-300, Jun. 1950.

(Continued)

*Primary Examiner*—Khanh V Nguyen
(74) *Attorney, Agent, or Firm*—Diederiks & Whitelaw, PLC (57) ABSTRACT

An amplifier circuit with current noise reduction employs first and second variable impedance devices between a signal source and an amplifier. A modulation frequency generator establishes a modulation frequency $f_{mod}$ to alter the first and second impedance values out of phase from one another at the modulation frequency so that the sum of the first and second impedance values at the input of the amplifier is relatively constant. The modulation at frequency $f_{mod}$ shifts the signal to side bands about the modulation frequency. The output from the amplifier is passed to a bandpass filter centered on the modulation frequency in order to remove all frequencies outside the bandwidth of interest. The signal itself is recovered by demodulating the output of the bandpass filter using a synchronization signal that is derived from the modulation signal.

19 Claims, 7 Drawing Sheets

U.S. PATENT DOCUMENTS

| | | |
|---|---|---|
| 6,433,632 B1 | 8/2002 | Nakamura et al. |
| 6,538,502 B2 * | 3/2003 | Nair et al. ............ 330/9 |
| 6,611,168 B1 | 8/2003 | Denison et al. |
| 6,617,910 B2 | 9/2003 | Quan |
| 6,643,540 B2 | 11/2003 | Yonce |
| 6,661,283 B1 | 12/2003 | Lee |
| 6,674,322 B2 | 1/2004 | Motz |
| 6,686,800 B2 | 2/2004 | Krupka |
| 6,696,890 B2 | 2/2004 | Hedberg et al. |
| 6,707,336 B2 | 3/2004 | Reber |
| 6,734,723 B2 | 5/2004 | Huijsing et al. |
| 6,750,703 B1 | 6/2004 | Shen et al. |
| 6,853,241 B2 | 2/2005 | Fujimoto |
| 6,925,325 B2 | 8/2005 | Yonce |
| 2003/0036691 A1 | 2/2003 | Stanaland et al. |

OTHER PUBLICATIONS

Prance et al., "Electrometer Arrays: Sensing of Spatio-Temporal ELF Fields", International Conference on Marine Electromagnetics, 1977.

Riehl et al., "High-Resolution Electrometer With Micromechanical Variable Capacitor", Solid-State Sensor, Actuator and Microsystems Workshop, pp. 305 308, Jun. 2-6, 2002.

Li et al., "A High Tuning-Ratio Silicon-Micromachined Variable Capacitor With Low Driving Voltage", Solid-State Sensor, Actuator and Microsystems Workshop, pp. 239-242, Jun. 2-6, 2002.

DARPA Phase II Proposal, "High Density Electric Vector Sensor Array for Non Contacting Measurement of EEG", DARPA #D022-0308, May 28, 2003.

* cited by examiner

FIG.6
square wave modulation

FIG. 7
sine wave modulation

AMPLIFIER CIRCUIT AND METHOD FOR REDUCING VOLTAGE AND CURRENT NOISE

CROSS-REFERENCE TO RELATED APPLICATIONS

The present application represents a National Stage application of pending PCT/US2005/032358 filed Sep. 9, 2005 entitled "Amplifier Circuit and Method for Reducing Voltage and Current Noise", and further claims the benefit of U.S. Provisional Patent Application Ser. No. 60/608,366 entitled "System and Method to Reduce Current Noise in High Impedance Circuits and Sensors" filed Sep. 10, 2004.

STATEMENT REGARDING FEDERALLY SPONSERED RESEARCH OR DEVELOPMENT

The U.S. Government has a paid-up license in this invention and the right in limited circumstances to require the patent owner to license others on reasonable terms as provided for by the terms of SBIR Phase II Contract DAAH01-03-C-R290.

BACKGROUND OF THE INVENTION

1. Field of the Invention

The present invention generally pertains to the art of active electronic devices and, in particular, electronic amplifiers which produce both voltage noise and current noise. More particularly, the invention relates to an amplifier circuit for reducing the effect of current noise at the amplifier input while also reducing the voltage noise in most practical cases.

2. Discussion of the Prior Art

Measurement and amplification systems are sometimes limited by the effect of their internal current noise acting on the impedance of an external element connected to the amplification system. This current noise is multiplied by the impedance of the element to give an effective voltage noise at the amplifier input. In an arrangement where an amplifier is connected to a very high impedance antenna, such as a pure capacitor, there will be a frequency below which the voltage noise referred to the system input is dominated by the effect of current noise acting on the antenna impedance. Essentially, as active electronic devices and, in particular, electronic amplifiers, produce both voltage noise and current noise, it is desirable to have some type of noise reduction system to make these devices more sensitive.

Figure 9:
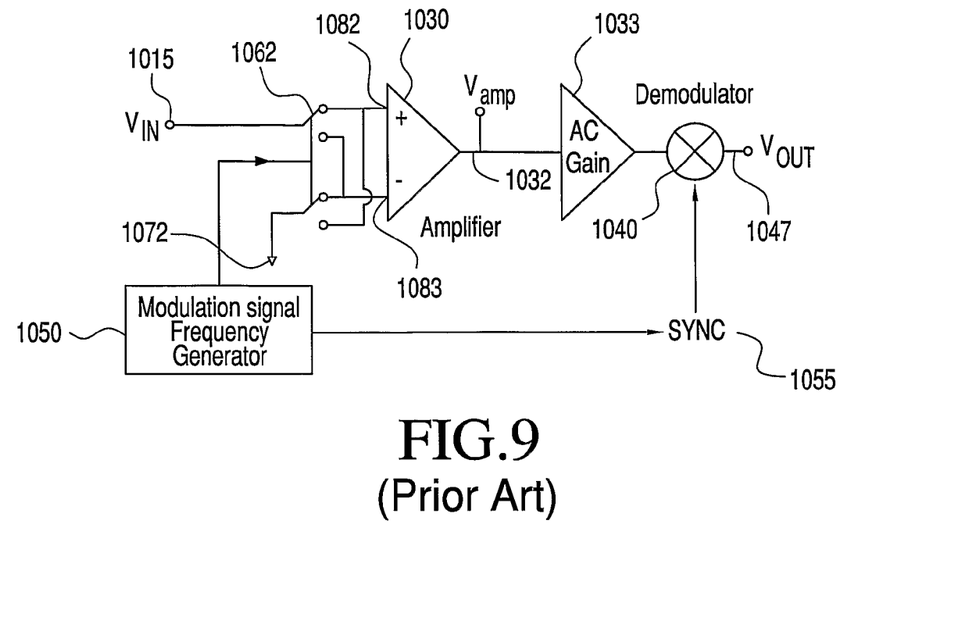
FIG. 9 is a circuit of a prior art simplified chopper stabilization scheme.

One proposed way of reducing the effect of voltage noise is to use the well-known method of chopping an input voltage signal. Such chopper stabilization was developed around 1950 and is currently the standard technique employed in low DC offset operational amplifiers. Referring to FIG. 9, there is shown an overall circuit using the chopper stabilization approach. A signal voltage source 1015 produces a signal $V_{IN}$ which is sent to an amplifier 1030. An output 1032 from amplifier 1030 connects to an AC gain amplifier 1033. An output of AC gain amplifier 1033 is connected with a demodulator 1040 which ultimately produces an output signal $V_{OUT}$ at output 1047. A modulation signal frequency generator 1050 is provided to send a synchronizing signal 1055 to demodulator 1040. Also, modulation signal frequency generator 1050 controls a switch 1062, while a ground is established at 1072. Switch 1062 ultimately sends voltage signal $V_{IN}$ to either a non-inverting terminal 1082 of amplifier 1030 or an inverting terminal 1083 of amplifier 1030 at the modulation signal frequency. The circuit switches voltage signal $V_{IN}$ at amplifier 1030 in order to reverse the sign of the signal presented at the amplifier input. DC input voltage signal $V_{IN}$ is transferred into an amplified AC signal $V_{amp}$, which can then be further amplified as an AC signal. Demodulator 1040 is provided to synchronously demodulate the signal back to a DC signal $V_{OUT}$ at output 1047.

Every amplifier has a DC offset or offset drift. In this case, the DC offset or offset drift is referenced as $V_{off}$. With the voltage at amplifier output 1032, $V_{amp}$, being a square wave signal which swings between $V_{IN}+V_{off}$ and $-V_{IN}+V_{off}$, any voltage due to the amplifier's offset drift, which essentially is a form of noise, has no effect on the peak to peak amplitude of the square wave which is given by $2V_{IN}$. If the input signal is not a DC signal but still alternates at a relatively low frequency, $f_s$, chopping generates sidebands about the chopping frequency, $f_{mod}$, occurring at $f_{mod} \pm f_s$. Converting the signal to a higher frequency is of benefit because, typically, the voltage noise of almost all amplifiers decreases with increasing frequency of the input signal.

Figure 10:
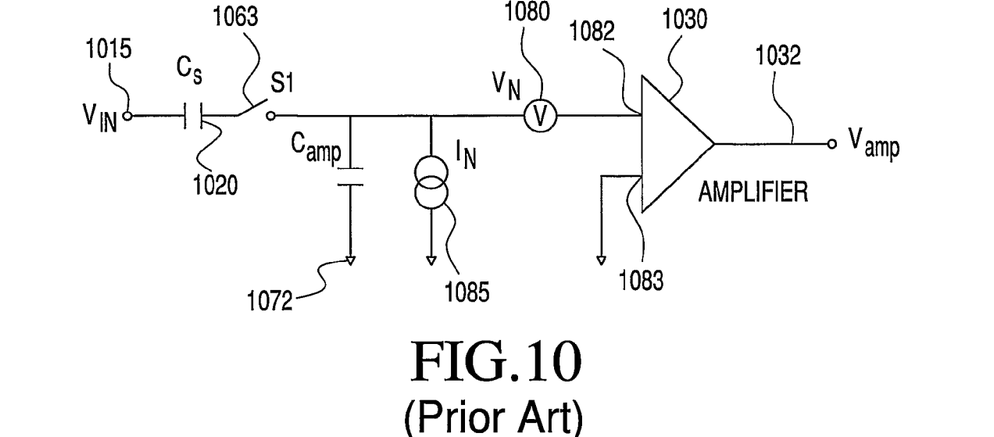
FIG. 10 is a circuit diagram of a prior art simple circuit used to illustrate chopper stabilization for an amplifier with capacitive input.

Another simple circuit to illustrate chopper stabilization for an amplifier 1030 with voltage source 1015 is shown in FIG. 10. Voltage source 1015 is connected through a capacitor 1020 to amplifier 1030 which provides an output at 1032. A switch 1063 is provided between capacitor 1020 and the non-inverting terminal 1082 of amplifier 1030. Inverting terminal 1083 is sent to ground 1072. The capacitance $C_{amp}$ of amplifier 1030 is also shown going to ground 1072. Finally, a voltage noise source 1080 and a current noise source 1085 is illustrated.

While the technique of chopper stabilization is well established and is effective at reducing an amplifier's voltage noise, it is ineffective in situations where the amplifier input noise is dominated by the amplifier's current noise. The circuit shown in FIG. 10 shows a situation where current noise $I_N$ is likely to be a limiting factor in the overall sensitivity of the device. An input signal, $V_{IN}$, is detected by antenna or voltage source 1015 in which impedances are represented by capacitance $C_s$. Capacitor 1020, having a capacitance $C_s$, is connected to amplifier 1030 with a gain of 1 and with input capacitance $C_{amp}$. Of course the gain could, be some other value besides 1. In any case, an input current noise, $I_N$, and a voltage noise, Vn, are also present as capacitor 1020 is connected through switch 1063. Chopper stabilization can be achieved by simply opening and closing switch 1063 at a certain frequency, $f_{mod}$, making amplifier 1030 insensitive and sensitive to signal $V_{IN}$ respectfully. If the circuit transfer function from the signal voltage to the amplifier is defined as $X_{sig}$ in the sensitive state, the voltage at output 1032 of amplifier 1030 is given by:

$$V_{amp,sens} = X_{sig}V_{IN} + I_N Z_{in} + V_N$$

$$= \frac{C_s}{C_s + C_{amp}} V_{IN} + \frac{I_N}{\omega(C_s + C_{amp})} + V_N$$

and in the insensitive state by:

$$V_{amp,insens} = \frac{I_N}{\omega C_{amp}} + V_N$$

With this in mind, at non-inverting terminal 1082 of amplifier 1039, the signal amplitude is multiplied by a square wave going between 0 and 1 at a frequency $f_{mod}$. The current is multiplied by a square wave going between $$\frac{1}{\omega(C_S + C_{amp})} \text{ and } \frac{1}{\omega C_{amp}}$$

at frequency $f_{mod}$, and the voltage noise is constant. The fact that the term which represents current noise is modulated at frequency $f_{mod}$ means that it is converted along with the signal and, thus, will not be eliminated or reduced.

Despite the above-discussed proposed solution to reduce voltage noise in an electronic amplifier, none of these methods have been successful at reducing current noise. Neither the traditional method of chopper stabilization nor the prior techniques of capacitive modulation offer effective reduction of current noise. Therefore, there exists a need in the art to provide an amplifier circuit with both voltage and current noise reduction.

SUMMARY OF THE INVENTION

The present invention is directed to a circuit which reduces the effect of amplifier current noise. This circuit also reduces the effective voltage noise in most practical cases. The circuit includes a signal source having an associated impedance producing a signal at a varying frequency. First and second variable impedance devices are provided between a signal source and an amplifier. A modulation frequency generator establishes a modulation frequency to alter the first and second impedance values out of phase from one another at the modulation frequency so that the sum of the first and second impedance values at the input of the amplifier is substantially constant, even while the first and second impedance values are varied. As a result, the modulation at frequency $f_{mod}$ shifts the signal to side bands about the modulation frequency. The modulation frequency is preferably chosen so that the side bands are in a regime at which the noise contribution to the effect of amplifier voltage noise is low. The output from the amplifier is then passed to a bandpass filter centered on the modulation frequency in order to remove all frequencies outside the bandwidth of interest. The signal itself is recovered by demodulating an output for the bandpass filter using a synchronization signal that is derived from the modulation signal. Finally, the demodulated voltage is directed through a low pass filter to generate a sensor output.

While the first and second variable impedance devices may take many forms, such as transistors, relays or diodes, but preferably the variable impedance devices are constituted by variable capacitors whose capacitive senses increase and decrease in either a square wave pattern or a sinusoidal wave pattern. It should be noted that, even if the variable capacitors have a maximum value which differs by 10%, the effective current and voltage noise can still be substantially reduced in the system.

Additional objects, features and advantages of the present invention will become more readily apparent from the following detailed description of preferred embodiments when taken in conjunction with the drawings wherein like reference numerals refer to corresponding parts in the several views.

DETAILED DESCRIPTION OF THE PREFERRED EMBODIMENTS

Figure 1:
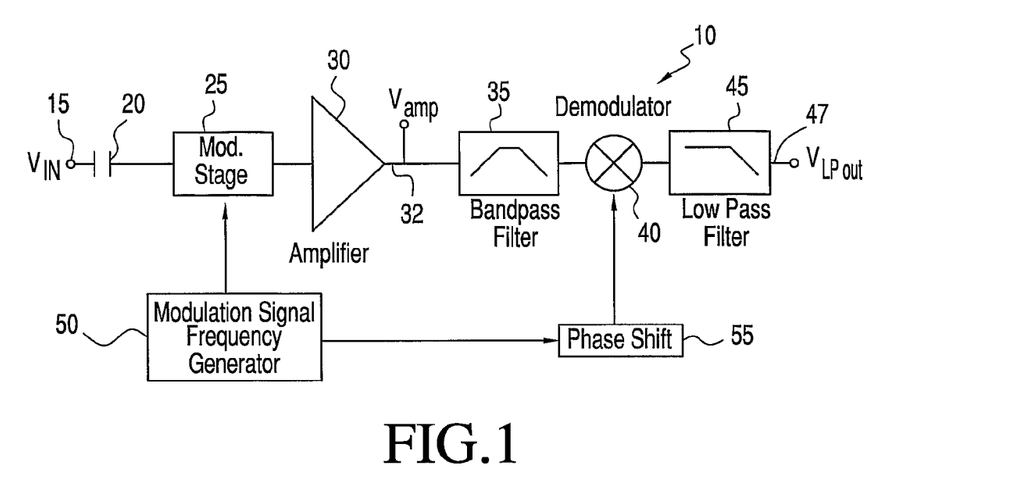
FIG. 1 is a circuit diagram of an amplifier circuit with voltage and current noise reduction according to a preferred embodiment of the invention.

With initial reference to FIG. 1, there is shown an amplifier circuit 10 with noise reduction constructed in accordance with the present invention. A signal source 15 produces an output signal $V_{IN}$ which is coupled to the rest of the system by a capacitive element 20, preferably constituted by a capacitive sensor or electrode, which measures an electric potential without conducting contact with the potential, or an antenna. Capacitive element 20 is connected to a modulation stage 25 which is buffered by a high input impedance, low noise, low input capacitance amplifier 30. An output 32 of amplifier 30 is connected to a bandpass filter 35. The signal then passes through a demodulator 40 to a low pass filter 45 and finally to an output 47. A modulation signal frequency generator 50 is provided to send a modulation signal to both modulation stage 25 and a phase shift mechanism 55. Input signal $V_{IN}$ is modulated at a frequency $f_{mod}$ which shifts the signal into side bands about the modulation frequency $f_{mod}$. The modulation frequency is chosen such that the side bands are in a regime at the voltage noise of amplifier 30 is low. An output $V_{amp}$ of amplifier 30 is then passed through bandpass filter 35 centered on the modulation frequency in order to remove all frequencies outside the bandwidth of interest. The signal is recovered by demodulating the output of bandpass filter 35 using a synchronization signal derived from the modulation signal. As shown in the drawing, modulation frequency signal generator 50 passes through phase shift mechanism 55 to control demodulator 40 to enable recovery of the signal. Finally, the demodulated voltage signal is filtered by low pass filter 45 to generate sensor output $V_{LPout}$ at 47.

Figure 2:
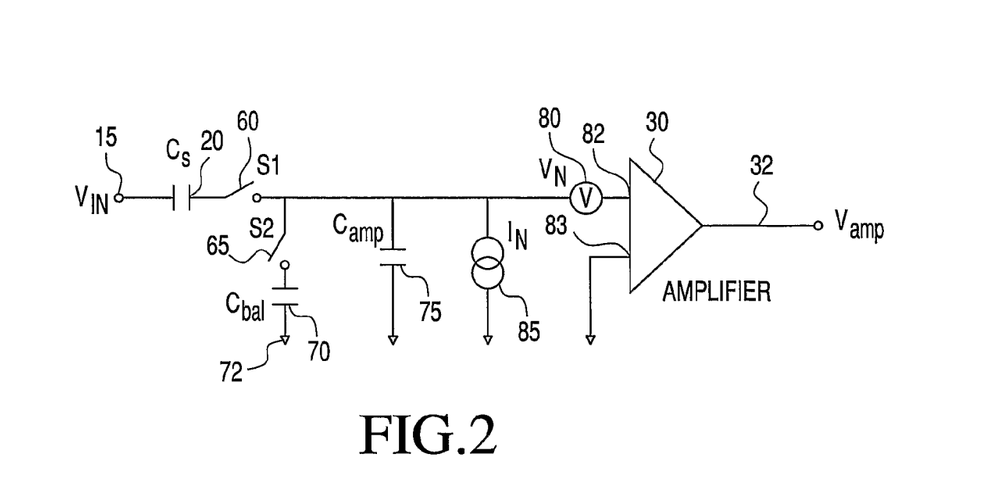
FIG. 2 is a circuit diagram showing voltage noise and current noise sources and a pair of switches S1 and S2 used to reduce noise in the system.

Turning now to FIG. 2, details of modulation stage 25 of FIG. 1 are represented. In this case, input signal $V_{IN}$ is detected by a capacitive antenna 15 shown as capacitive element 20, $C_s$. Although a pure capacitance is shown the antenna could also have a resistive coupling with the caveat that for the invention applies preferably to antennas with high impedance. Capacitive element 20 is connected to amplifier 30 through a first variable impedance device or switch 60. A second variable impedance device or switch 65 is provided connecting the line between switch 60 and amplifier 30 with a capacitor 70 to ground 72. Switches 60 and 65 may be transistors, relays or diodes. Capacitor 70 has a capacitive value $C_{bal}$ which represents a balancing capacitance. Switch 65 is operated out of phase with switch 60 in accordance with the modulation frequency produced by modulation frequency signal generator 50 of FIG. 1.

As also shown in FIG. 2, amplifier 30 has an associated capacitance $C_{amp}$ as established by capacitor 75 which is also connected to ground 72. Further, amplifier 30 has an input voltage noise $V_N$ as represented by voltage noise source 80 and an input current noise $I_N$ as represented by current noise source 85.

When the balancing capacitor $C_{bal}$ is switched as described, the amplifier voltage swings between $$V_{amp,sens} = \frac{C_s}{C_s + C_{amp}} V_{IN} + \frac{I_N}{\omega(C_s + C_{amp})} + V_N$$

and $$V_{amp,insens} = \frac{I_N}{\omega(C_{bal} + C_{amp})} + V_N$$

In this case the square wave being applied to the current noise goes between $$\frac{1}{\omega}\left(\frac{1}{C_s} + \frac{1}{C_{amp}}\right)$$

in a sensitive state and $$\frac{1}{\omega}\left(\frac{1}{C_{bal}} + \frac{1}{C_{amp}}\right)$$

in an insensitive state. Therefore the component of the amplifier output 32 due to noise at frequency $f_n$ is given, for $I_N = I_{N_o} \sin(2\pi f_n t)$, by:

$$V_{amp,noise} = \frac{I_{N_0}}{2\pi f_n} \left\{ \frac{1}{2}\left(\frac{1}{(C_S + C_{amp})} + \frac{1}{(C_{bal} + C_{amp})}\right) \sin(2\pi f_n t) + \frac{1}{\pi}\left(\frac{1}{(C_S + C_{amp})} - \frac{1}{(C_{bal} + C_{amp})}\right)[\cos(2\pi(f_{mod} - f_n)t) - \cos(2\pi(f_{mod} + f_n)t)] \right\}$$

In this expression, the signal is described by the second or lower term. The amount of low frequency mixing is proportional to the change in impedance at the amplifier's input. By matching the values of $C_s$ and $C_{bal}$, a high degree of rejection to mixing of low-frequency current noise is produced.

Chopper stabilization in electronic circuits is usually implemented using semiconductor switches, such as transistors. However, these switches are not well suited to applications of the invention in which sensitivity is critical because of leakage in an off mode and charge injection when switching. The leakage and charge injection could increase overall noise of the system to unacceptable levels. Resistive or contact switching is preferably achieved using microelectromechanical systems (MEMS). Such switches evince current lifetimes in the order of $10^7$ cycles. As this lifetime may be considered inadequate at the switching frequencies typically needed for adequate conversion of signals.

Figure 3:
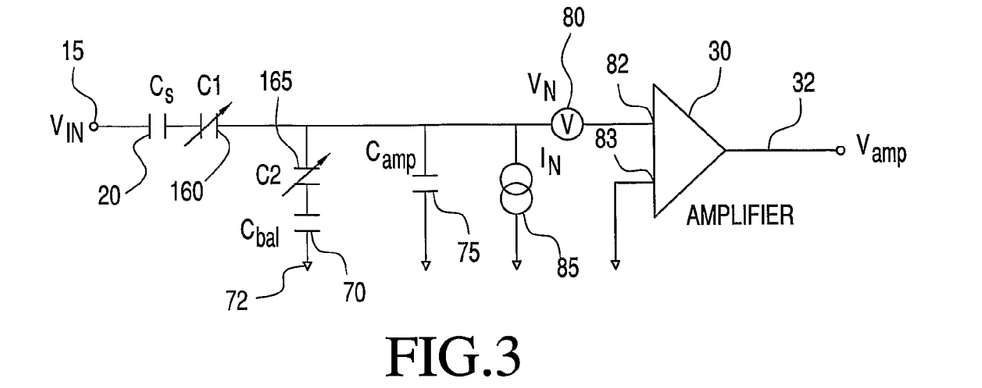
FIG. 3 is a circuit diagram wherein switches S1 and S2 have been replaced with variable capacitors.

In the preferred embodiment of the present invention, input capacitance modulation is employed. Essentially, switches 60 and 65 of FIG. 2 are replaced with variable capacitors 160 and 165 as shown in FIG. 3. In this case, amplifier 30 is alternatively sensitized and desensitized to $V_{IN}$ by modulating capacitor 160. As in the case of switches, capacitor 165, having a capacitance value C2, is modulated 180° out of phase with capacitor 160 having a capacitance value C1. In order to keep amplifier input impedance $V_{IN}$ constant, capacitors 160 and 165 are designed for use with low noise amplifiers and are preferably fabricated using MEMS technology.

Setting $C_s = C_{bal} = C_0$, then the case when $C_1 = C_{max}$ and $C_2 = C_{min}$, which corresponds to the amplifier being sensitive to the signal, $X_{sig}$ becomes:

$$V_{amp,sens} = \frac{C_0 C_{max}/(C_0 + C_{max})}{C_{tot}} V_{IN} + \frac{I_N}{\omega C_{tot}} + V_N$$

where $C_{tot} = C_0 C_{max}/(C_0 + C_{max}) + C_0 C_{min}/(C_0 + C_{min}) + C_{amp}$ is the total capacitance of the input circuit. When the amplifier is desensitized to the input signal, $C_1 = C_{min}$ and $C_2 = C_{max}$, such that:

$$V_{amp,insens} = \frac{C_0 C_{min}/(C_0 + C_{min})}{C_{tot}} V_{IN} + \frac{I_N}{\omega C_{tot}} + V_N$$

The total capacitance of the input circuit remains unchanged, and therefore the voltage generated by current noise flowing through the input circuit also remains unchanged as capacitors 160 and 165 are modulated.

Figure 4:
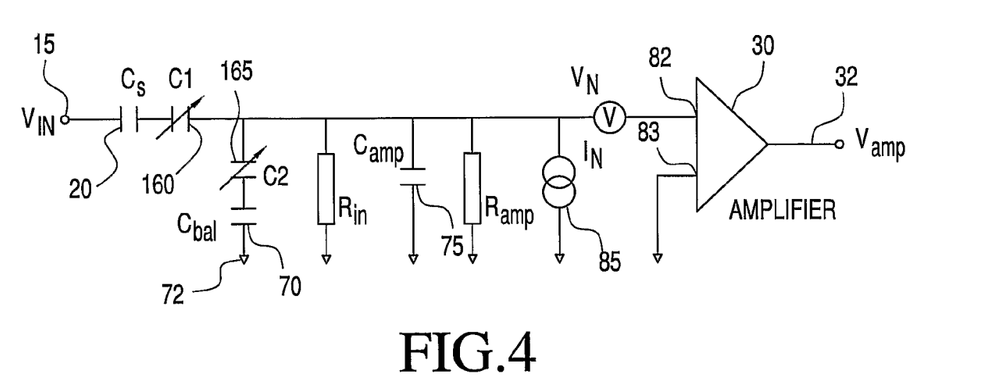
FIG. 4 is a circuit diagram similar to FIG. 3 wherein an input resistance and amplifier resistance are shown.

Turning now to FIG. 4, there is shown the circuit diagram of FIG. 3 with the addition of a resistor $R_{IN}$ which offers a path to ground for DC biased currents of amplifier 30. Amplifier 30 also has an input capacitance $C_{amp}$ in capacitor 75 and an input resistance $R_{amp}$. It will be appreciated that resistor $R_{IN}$ could be replaced by a bias current stabilization scheme as taught in U.S. Pat. No. 6,686,800 which is incorporated herein by reference. It should be noted that there are many practical cases in which it is desirable to make a measurement with two different sensors and take the difference of their outputs. To this end, the circuit shown in FIG. 4 can be used to measure the potential on separate sensors by replacing balance capacitor 70 with a second capacitor sensor element (not shown) that is carefully matched to first capacitive element 20.

Figure 5A:
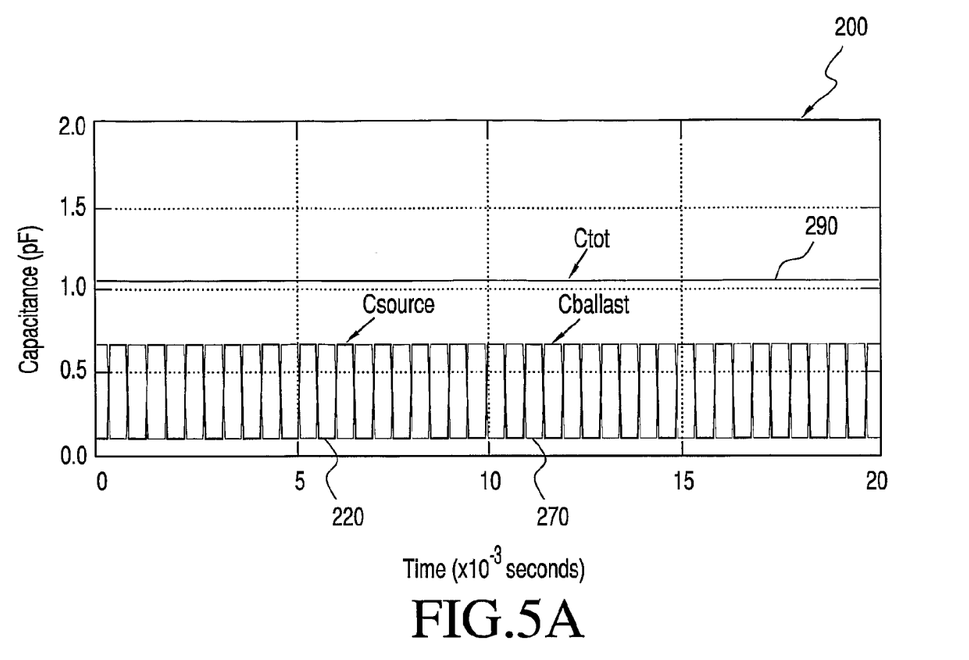
FIG. 5A is a graph showing how capacitance changes as a function of time in accordance with the invention using square wave modulation.
Figure 5B:
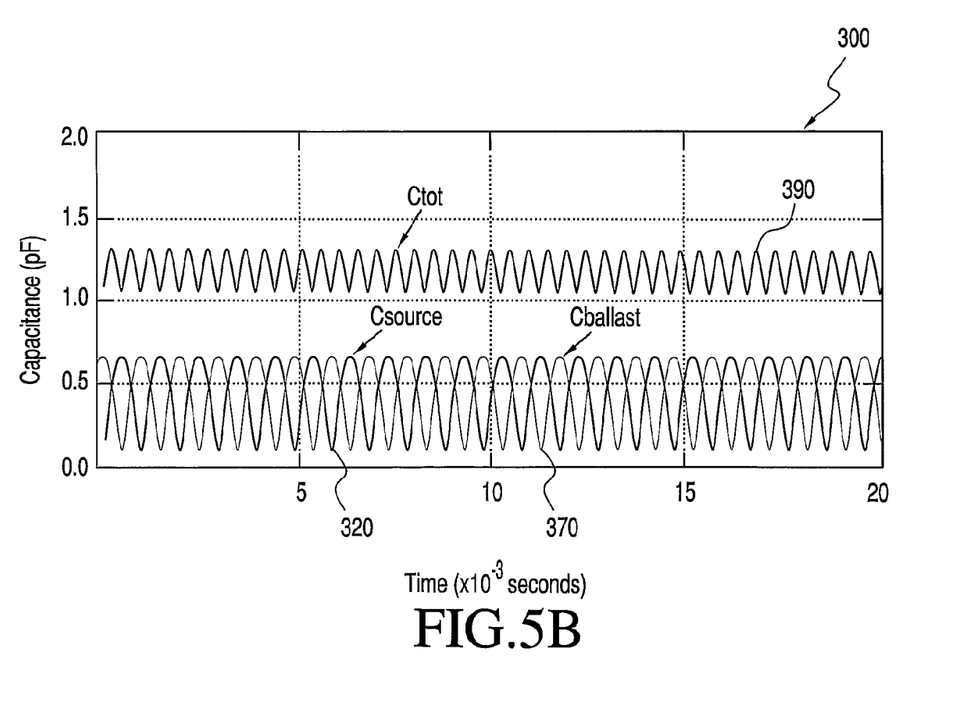
FIG. 5B is a graph of capacitance versus time for sine wave modulation.

FIGS. 5A and 5B represent plots for two types of modulation. FIG. 5A represents a square wave modulation of capacitance value C1 and C2, and FIG. 5B represents a sign wave modulation of C1 and C2. Each plot presents the curves for $$C_{tot}, C_{source} = \frac{C_s C_1}{C_s + C_1} \text{ and } C_{ballast} = \frac{C_{bal} C_2}{C_{bal} + C_2}$$

for the following parameters: $C_s=1$ pF, $C_{bal}=1$ pF, $C_1$ modulation between 0.1 and 2 pF, $C_2$ modulation between 0.1 and 2 pF, and modulation frequency $f_{mod}=1024$ Hz. In the case of square wave modulation, the value for $C_{tot}$, remains unchanged. However, $C_{tot}$, in the case of a sine wave, is modulated at $2 \times f_{mod}$, which causes conversion of the current noise at twice the modulation frequency. This additional noise can be addressed by filtering before demodulation. Note also the nonlinear behavior for both $C_{source}$ and $C_{ballast}$ which is due to the presence of sinusoidal components in the denominators for both $C_{Source}$ and $C_{ballast}$. However, these nonlinearities are compensated for through established circuit parameters.

Figure 6:
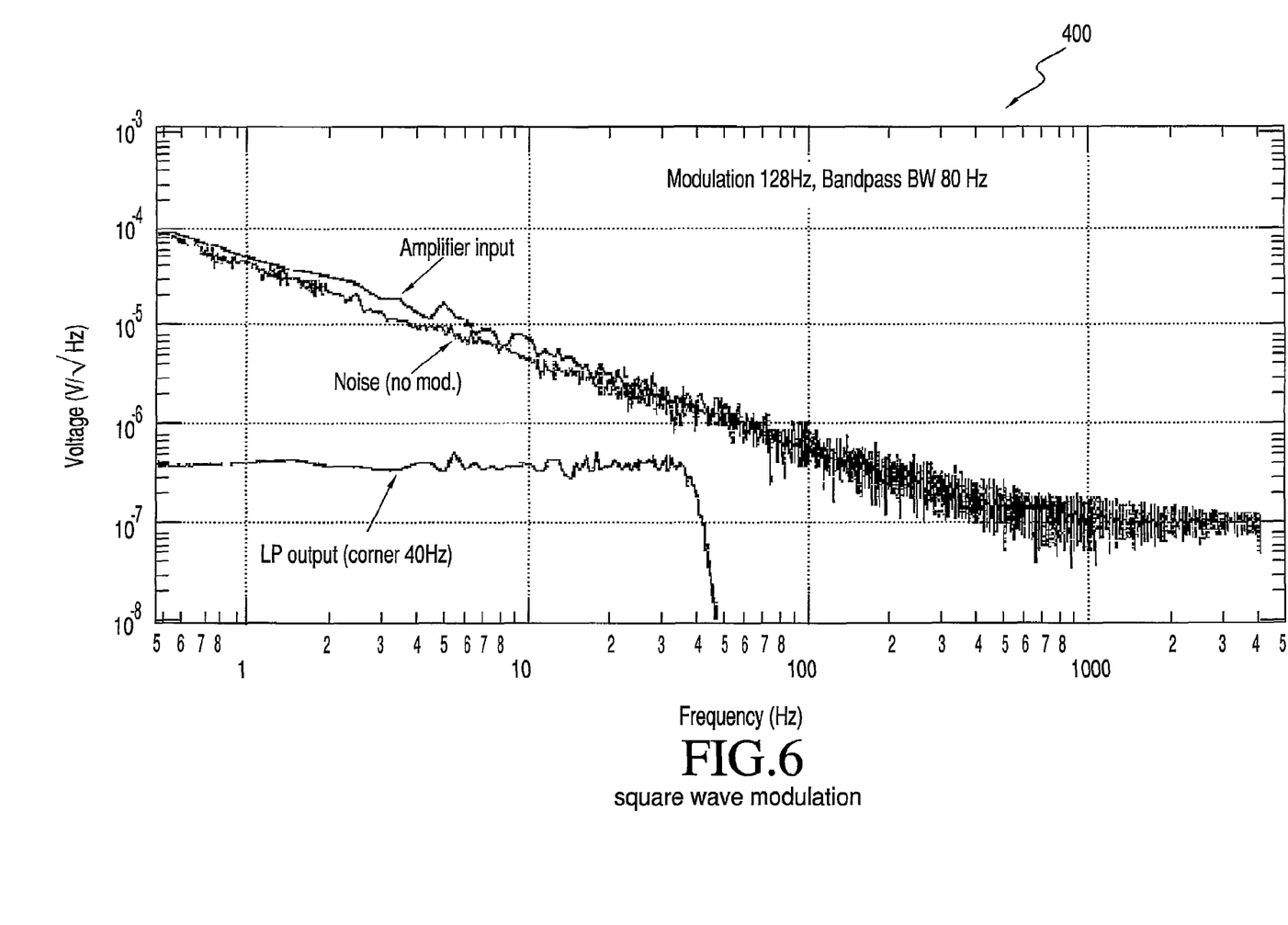
FIG. 6 is a graph showing noise spectral density for square wave modulation.
Figure 7:
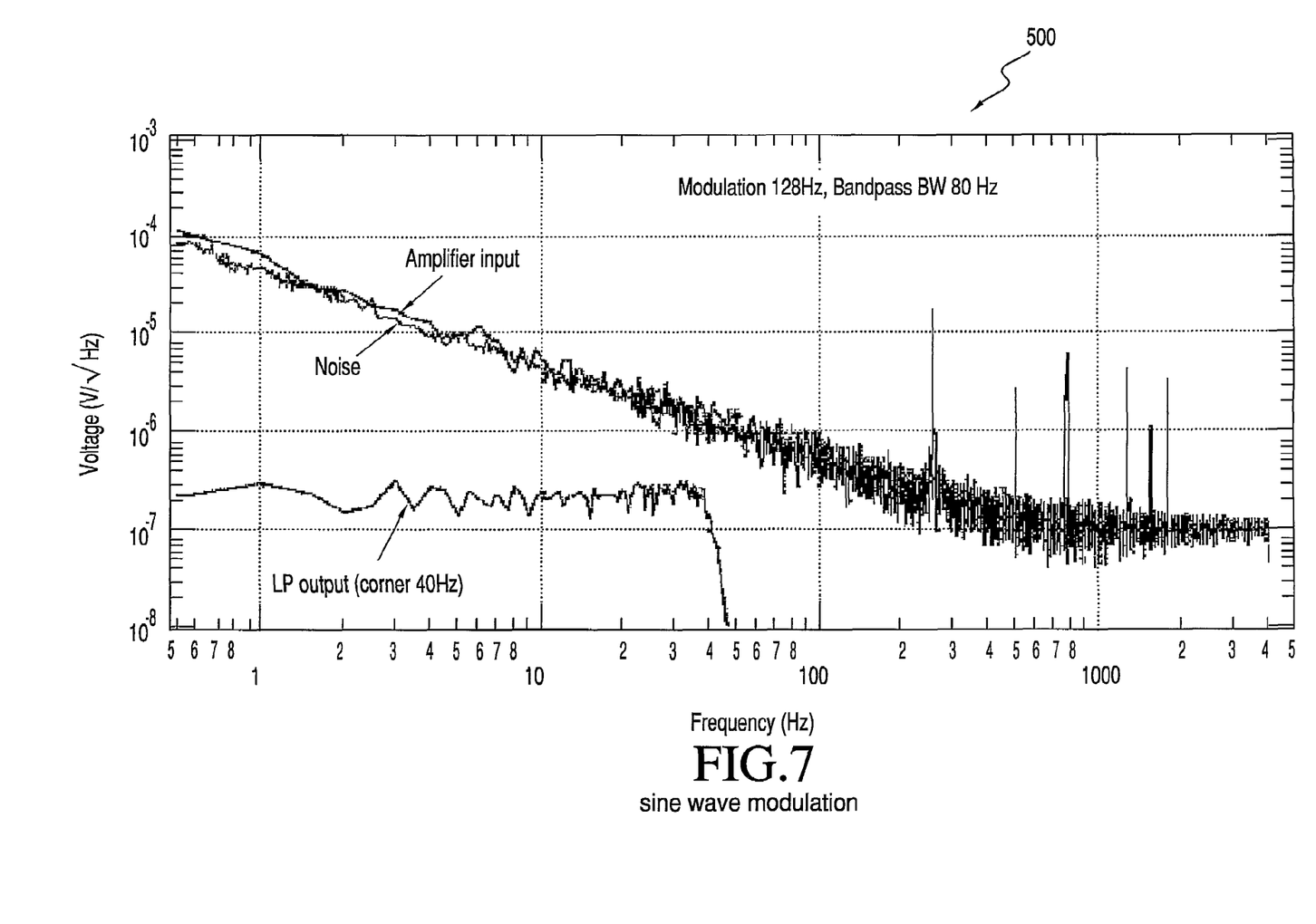
FIG. 7 is a graph showing noise spectral density for sine wave modulation.
Figure 8:
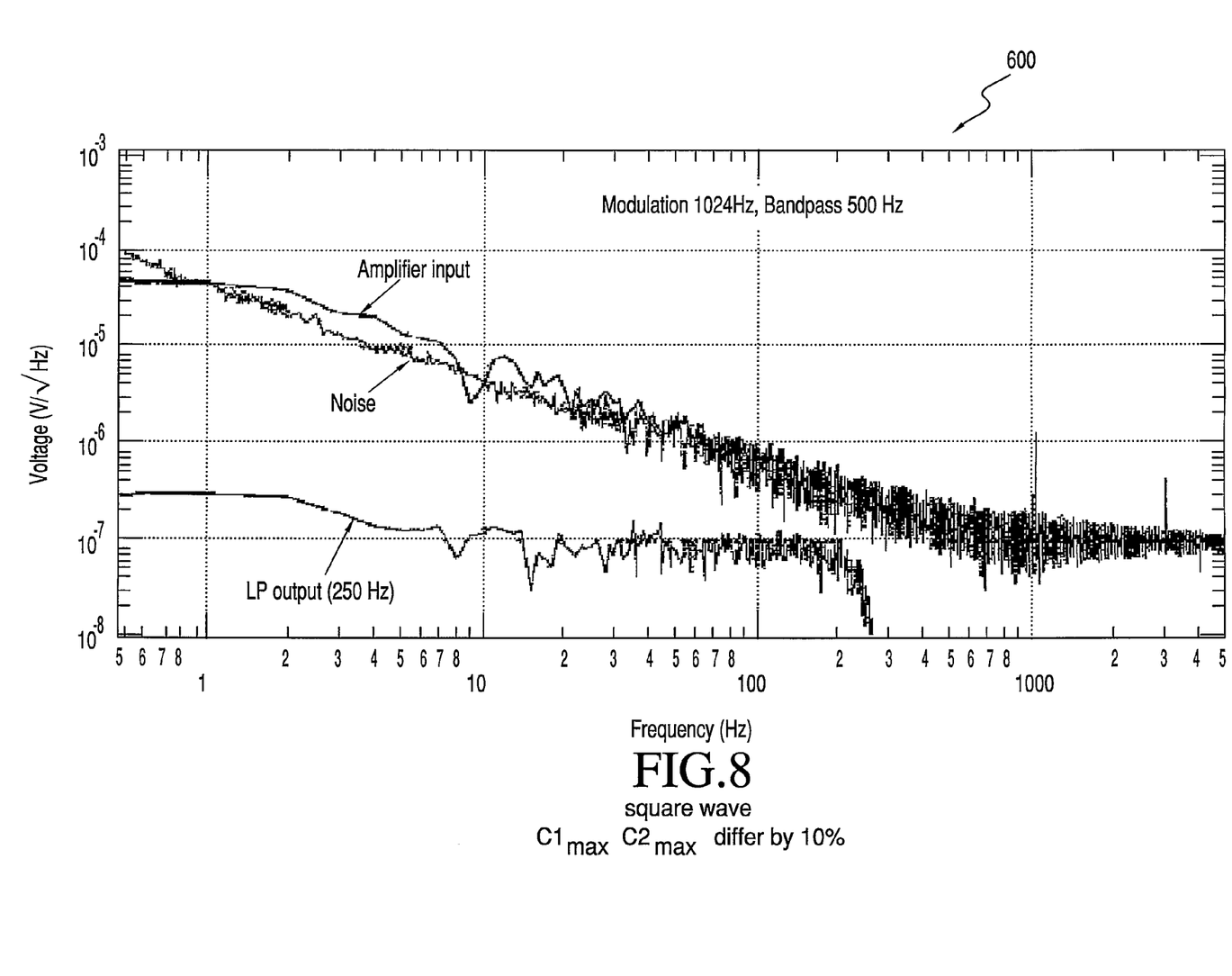
FIG. 8 is a graph showing noise spectral density for square wave modulation in a case wherein variable capacitors employed differ in maximum value by 10%.

FIGS. 6 and 7 compare the total effective input noise with and without signal modulation in a circuit for measuring voltages of very high impedance constructed in accordance with the present invention. FIG. 6 in particular shows the reduction in noise referred to the input for a perfect square wave modulation, while FIG. 7 shows the same case, but for pure sine wave modulation. FIG. 8 shows a case in which the modulation frequency is 120 Hz and the variable capacitor C1 and C2 differ in the maximum value by 10% due to variations in production. It can be seen that the method of the invention is relatively robust with imperfections in internal parameters.

Based on the above, it should be readily apparent that first and second variable impedance devices are maintained out of phase from one another at an established modulation frequency such that the sum of impedance values associated with the first and second variable impedance devices at an input to the amplifier remains substantially constant. The modulation shifts a signal of interest to side bands about the modulation frequency such that, when an output of the amplifier is directed through a bandpass filter centered on the modulation frequency, essentially all frequencies outside a bandwidth of interest is removed. Demodulating the output of the bandpass filter is performed to recover the signal through the use of a synchronization signal derived based on the modulation signal. In this manner, the amplifier circuit of the present invention effectively reduces the current noise of the first stage amplifier. With the inclusion of a balancing element, fine adjustments can be made for the reduction in the effective current noise. In the practical case that the voltage noise of the amplifier also varies with frequency, the modulation so described can also be used to convert the signal to a region of lower voltage noise, thereby reducing the effective voltage noise of the amplifier.

Although described with reference to preferred embodiments of the invention, it should be readily understood that various changes and/or modifications can be made to the invention without departing from the spirit thereof. For instance, the first and second variable impedance devices could be constituted by variable resistors. In general, the invention is only intended to be limited by the scope of the following claims.

I claim:

1. An amplifier circuit with voltage and current noise reduction comprising:
   a signal source having an associated impedance for producing a signal varying at a frequency;
   a first variable impedance device having a first impedance value connected to said signal source;
   a second variable impedance device having a second impedance value connected to said signal source;
   an amplifier connected to the first and second variable impedance devices; and
   a modulation frequency generator for generating a modulation frequency and establishing a form of modulation in which the first and second impedance values are out of phase from one another and at the modulation frequency so that a net impedance seen at the input amplifier is held substantially constant over time while the first and second impedance values are varied to reduce both voltage and current noises.

2. The amplifier circuit according to claim 1, wherein the form of modulation has side band frequencies, said first and second variable impedance devices, shifting the signal to the side band frequencies.

3. The amplifier circuit according to claim 1, wherein the signal source comprises a capacitive sensor that measures an electric potential without conducting contact with the potential.

4. The amplifier circuit according to claim 3, wherein the impedance of the signal source is substantially capacitive in nature at the frequency.

5. The amplifier circuit according to claim 1, wherein the first and second variable impedance devices constitute switches.

6. The amplifier circuit according to claim 5, wherein the switches are selected from the group consisting of transistors, relays and diodes.

7. The amplifier circuit according to claim 1, wherein the first and second variable impedance devices constitute variable capacitors.

8. The amplifier circuit according to claim 7, wherein the variable capacitors are constructed employing microelectromechanical technology.

9. The amplifier circuit according to claim 1, wherein the form of modulation is periodic.

10. The amplifier circuit according to claim 9, wherein the form of modulation is a square wave.

11. The amplifier circuit according to claim 9, wherein the form of modulation is a sinusoidal wave.

12. The amplifier circuit according to claim 1, wherein the second variable impedance device constitutes a balancing element for reducing the current noise.

13. The amplifier circuit according to claim 1, further comprising: a demodulator located downstream of the amplifier for recovering the signal.

14. The amplifier circuit according to claim 13, further comprising: a band pass filter, disposed between the amplifier and the demodulator, for removing frequencies outside a band width of interest.

15. The amplifier circuit according to claim 14, further comprising: a low pass filter, located downstream of the demodulator, said low pass filter providing a sensor output signal.

16. A method for reducing voltage and current noise in an amplifier circuit comprising:
    sensing a signal with a capacitive element;
    sending the signal to an input of an amplifier;
    varying a first impedance over time between the capacitive element and the input of the amplifier;
    varying a second impedance over time between a ground and the input of the amplifier, wherein the varying of the first and second impedances over time is performed at a certain modulation frequency so as to modulate the signal, thereby creating a modulated signal which is transferred to a side band frequency; and
    controlling the varying of the first and second impedances so that a net impedance seen at the input of the amplifier is held substantially constant over time.

17. The method of claim 16, further comprising:
    amplifying the modulated signal to create an amplified modulated signal;
    filtering the amplified modulated signal with a band pass filter centered on a modulation frequency of interest to establish a filtered signal having substantially all fre quencies outside the modulation frequency of interest removed; and demodulating the filtered signal using a synchronizing signal to create a demodulated signal.

18. The method of claim 17, further comprising: filtering the demodulated signal to produce a sensor output signal.

19. The method of claim 16, wherein the signal is sensed with a capacitive sensor that measures an electric potential without conducting contact with the potential.

* * * * *

UNITED STATES PATENT AND TRADEMARK OFFICE
CERTIFICATE OF CORRECTION

| | | |
|---|---|---|
| PATENT NO. | : 7,518,443 B2 | Page 1 of 1 |
| APPLICATION NO. | : 11/662381 | |
| DATED | : April 14, 2009 | |
| INVENTOR(S) | : Matthews | |

It is certified that error appears in the above-identified patent and that said Letters Patent is hereby corrected as shown below:

Column 1, lines 15-22 should read as follows:

STATEMENT REGARDING FEDERALLY
SPONSORED RESEARCH OR DEVELOPMENT

This invention was made with Government support under contract DAAH01-03-C-R290 awarded by the US Army Aviation and Missile Command. The Government has certain rights in the invention.

Signed and Sealed this
Twenty-eighth Day of December, 2010

David J. Kappos
*Director of the United States Patent and Trademark Office*